United States Patent
Chen et al.

(10) Patent No.: US 8,440,580 B2
(45) Date of Patent: May 14, 2013

(54) METHOD OF FABRICATING SILICON NITRIDE GAP-FILLING LAYER

(75) Inventors: Neng-Kuo Chen, Hsinchu (TW); Chao-Ching Hsieh, Hsinchu County (TW); Chien-Chung Huang, Taichung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 51 days.

(21) Appl. No.: 11/853,475

(22) Filed: Sep. 11, 2007

(65) Prior Publication Data
US 2009/0068854 A1 Mar. 12, 2009

(51) Int. Cl.
H01L 21/31 (2006.01)
H01L 21/469 (2006.01)

(52) U.S. Cl.
USPC ............................ 438/791; 438/436; 438/437

(58) Field of Classification Search .................. 438/761, 438/791, 763, 778, 436
See application file for complete search history.

(56) References Cited

U.S. PATENT DOCUMENTS

| | | | | |
|---|---|---|---|---|
| 6,867,141 B2 * | 3/2005 | Jung et al. | ...................... | 438/695 |
| 6,992,021 B2 * | 1/2006 | Lin et al. | ....................... | 438/775 |
| 7,327,948 B1 * | 2/2008 | Shrinivasan et al. | .......... | 392/416 |
| 2005/0272220 A1 * | 12/2005 | Waldfried et al. | ............. | 438/400 |
| 2006/0223290 A1 * | 10/2006 | Belyansky et al. | ........... | 438/520 |
| 2007/0105292 A1 | 5/2007 | Chen et al. | | |
| 2007/0108525 A1 * | 5/2007 | Yang et al. | ..................... | 257/351 |
| 2008/0173908 A1 * | 7/2008 | Junker et al. | ................... | 257/288 |
| 2009/0289284 A1 * | 11/2009 | Goh et al. | ...................... | 257/288 |

FOREIGN PATENT DOCUMENTS

| | | |
|---|---|---|
| TW | 200700578 | 1/2007 |
| TW | 200710954 | 3/2007 |

OTHER PUBLICATIONS

Dharmadhikari et al., "UV-assisted Processing for Advanced Dielectric Films", Solid State Technology, pp. 43-46, Mar. 2005.*

* cited by examiner

Primary Examiner — Daniel Luke
(74) Attorney, Agent, or Firm — Ding Yu Tan

(57) ABSTRACT

A method for fabricating a silicon nitride gap-filling layer is provided. A pre-multi-step formation process is performed to form a stacked layer constituting as a dense film on a substrate. Then, a post-single step deposition process is conducted to form a cap layer constituting as a sparse film on the stacked layer, wherein the cap layer has a thickness of at least 10% of the total film thickness.

17 Claims, 8 Drawing Sheets

METHOD OF FABRICATING SILICON NITRIDE GAP-FILLING LAYER

BACKGROUND OF THE INVENTION

1. Field of Invention

The present invention relates to a semiconductor gap-filling layer and a method of fabricating the same. More particularly, the present invention relates to a silicon nitride gap-filling layer and a method of fabricating the same.

2. Description of Related Art

With the development of technology on electronic equipments for communication, etc., the operating speed of a transistor increases rapidly. However, limited by the mobility of electrons and holes in a silicon channel, the area of application of a transistor is limited.

Altering the mobility rate of electrons and holes in the channel by controlling the mechanical stress in the channel is one approach to overcome the limitations generated from the miniaturization of a device.

The application of silicon nitride as a contact etching stop layer (CESL) has been proposed for generating strain to influence the driving current and ion gain of a transistor; and thus improving the efficiency of the device. This type of technique is known as localized mechanical stress control.

The strain of a contact etching stop layer is directly proportional to the stress and the thickness of the film layer. Accordingly, increasing the thickness and the strain of the film layer can respectively increase the strain of the contact etching stop layer.

The contact etching stop layer is formed after the fabrication of the silicide layer of the device is completed. However, the commonly used silicide (NiSi) is unable to endure a higher thermal budget. Therefore, the contact etching stop layer must be fabricated in a temperature below 550° C. However, the tensile stress of silicon nitride formed below 550° C. is inadequate. Accordingly, the tensile stress of a contact etching stop layer is typically improved by performing a curing process after deposition.

Regarding the approach of increasing the thickness of the contact etching stop layer, seam and void 100 as shown in FIG. 1, are easily generated due to the overly thick silicon nitride layer 102 and the insufficient gap-filling capability of the subsequently deposited dielectric layer 104. Consequently, problems of residues from contact etching or short circuit between contacts or between the contact and the gate are resulted. On the other hand, performing the curing process for enhancing the stress of the silicon nitride layer after the deposition process may result with problems of crack generated in the overly thick silicon nitride layer.

SUMMARY OF THE INVENTION

The present invention is to provide a contact etching stop layer and a method of fabricating the same, wherein not only sufficient thickness and stress are provided to increase the ion gain window of a device and to enhance the efficiency of the device, the gap-filling capability of the contact etching stop layer is also improved to avoid problems of void generation.

The present invention is to provide a method for fabricating a silicon nitride gap-filling layer. The method includes performing a pre-multi-step formation process, wherein a stacked film layer is formed on a substrate for establishing a dense area, followed by performing a post single-step deposition process to form a cap layer on the stacked film layer for establishing a sparse area, wherein the thickness of the cap layer is at least about 10% of the total film thickness of the silicon nitride gap filling layer.

According to an embodiment of the present invention, the pre-multi-step formation process in the method for fabricating a silicon nitride layer includes performing a plurality of pre single-step deposition processes. Further, a curing process is performed subsequent to each single-step deposition process.

According to an embodiment of the method for fabricating a silicon nitride layer of the present invention, each pre single-step deposition process includes atomic layer deposition (ALD), plasma enhance chemical vapor deposition (PECVD), high density plasma chemical vapor deposition (HDP) or low pressure chemical vapor deposition (LPCVD).

According to an embodiment of the method for fabricating a silicon nitride layer of the present invention, the process condition of each pre single-step deposition process includes a gas flow rate for silane ($SiH_4$) of about 20 to 2000 sccm, a gas flow rate for ammonia ($NH_3$) of about 50 to 10000 sccm, a gas flow rate for nitrogen ($N_2$) of about 500 to 30000 sccm, a temperature of about 200 to 700 degrees Celsius, and a high frequency power of radio frequency of about 40 to 3000 watts.

According to an embodiment of the method for fabricating a silicon nitride layer of the present invention, the process condition of each curing process includes a temperature of about 150 to 170 degrees Celsius, a process period of about 10 seconds to about 60 minutes; a pressure of about 10 to 760 torrs, an electrical power of about 50 to 1000 watts and a light source of 100 to 400 nm of ultra-violet light.

According to an embodiment of the method for fabricating a silicon nitride layer of the present invention, each film layer of the stacked film layer is a conformal layer.

According to an embodiment of the fabrication method for a silicon nitride layer of the present invention, each film layer of the stacked film layer is about 100 angstroms to about 500 angstroms thick.

According to an embodiment of the fabrication method for a silicon nitride layer of the present invention, the cap layer is about 500 to 1000 angstroms thick.

According to an embodiment of the fabrication method for a silicon nitride layer of the present invention, each post single-step deposition process includes atomic layer deposition, plasma enhance chemical vapor deposition, high density plasma chemical vapor deposition or low pressure chemical vapor deposition.

According to an embodiment of the fabrication method for a silicon nitride layer of the present invention, the process condition of each post single-step deposition process includes using silane ($SiH_4$), ammonia ($NH_3$), and nitrogen ($N_2$) as a reaction gas, wherein the gas flow rate of $SiH_4$ is about 20 to 2000 sccm, the gas flow rate of $NH_3$ is about 50 to 10000 sccm, the gas flow rate of $N_2$ is about 500 to 30000 sccm, the temperature is about 200 to 700 degrees, the high frequency power of radio frequency is about 40 to about 3000 watts.

According to an embodiment of the fabrication method for a silicon nitride layer of the present invention, the stress of each film layer of the stacked film layer is different from the stress of the cap layer.

According to an embodiment of the fabrication method for a silicon nitride layer of the present invention, the stress of each film layer of the stacked film layer is about 1.5 GPa.

According to an embodiment of the fabrication method for a silicon nitride layer of the present invention, the stress of the cap layer is about 1.2 GPa.

According to an embodiment of the fabrication method for a silicon nitride layer of the present invention, a curing process is optionally performed after the post single-step deposition process is completed.

According to an embodiment of the fabrication method for a silicon nitride layer of the present invention, the process conditions of the curing process includes a process temperature of about 150 to 170 degrees Celsius, a process period of about 10 seconds to about 60 minutes, a pressure of about 10 to 760 torrs, an electrical power of about 50 to 1000 watts, and an ultra-violet light source of about 100 to about 400 nm.

According to an embodiment of the fabrication method for a silicon nitride layer of the present invention, an etching process may be performed selectively between the plurality of pre single-step deposition processes of the pre-multi-step formation process or between the pre-multi-step formation process and the post single-step deposition process to remove a portion of the stacked film layer.

The present invention further provides a silicon nitride gap-filling layer that includes a stacked film layer to constitute a dense region, and a cap layer configured on the stacked film layer to constitute a sparse area, wherein the thickness of the cap layer is at least about 10% of the total thickness of the silicon nitride gap filling layer.

According to an embodiment of the present invention, in the above-mentioned silicon nitride layer, each film layer of the stacked film layer is a conformal layer.

According to an embodiment of the present invention, in the above-mentioned silicon nitride layer, each film layer of the stacked film layer is about 100 angstroms to about 500 angstroms thick.

According to an embodiment of the present invention, in the above-mentioned silicon nitride layer, the cap layer is about 500 to about 1000 angstroms thick.

According to an embodiment of the present invention, in the above-mentioned silicon nitride layer, the stress of each film layer of the stacked film layer is different from the stress of the cap layer.

According to an embodiment of the present invention, in the above-mentioned silicon nitride layer, the stress of each film layer of the stacked film layer is about 1.5 GPa.

According to an embodiment of the present invention, in the above-mentioned silicon nitride layer, the stress of the cap layer is about 1.2 GPa.

According to the contact etching stop layer fabricated according to the method of the present invention, not only the contact etching stop layer has a sufficient thickness and stress for enhancing the ion gain of the device and the efficiency of the device, the trench filling capability is also improved to obviate the problems generated from seam formation. Moreover, the tearing of the contact etching stop layer can also be prevented.

In order to make the aforementioned and other objects, features and advantages of the present invention comprehensible, a preferred embodiment accompanied with figures is described in detail below.

DESCRIPTION OF EMBODIMENTS

Figure 1:
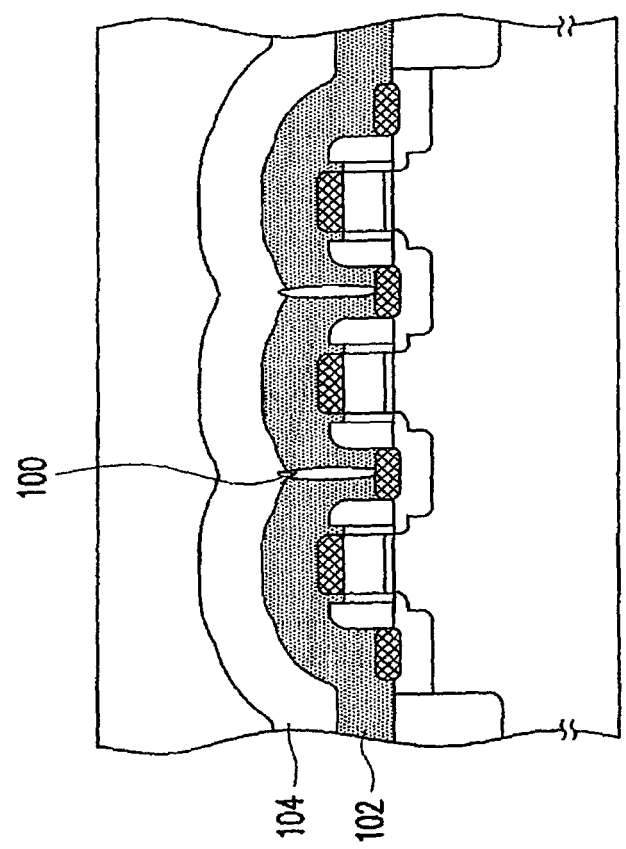
FIG. 1 is a schematic, cross-sectional view of a conventional semiconductor device.
Figure 2:
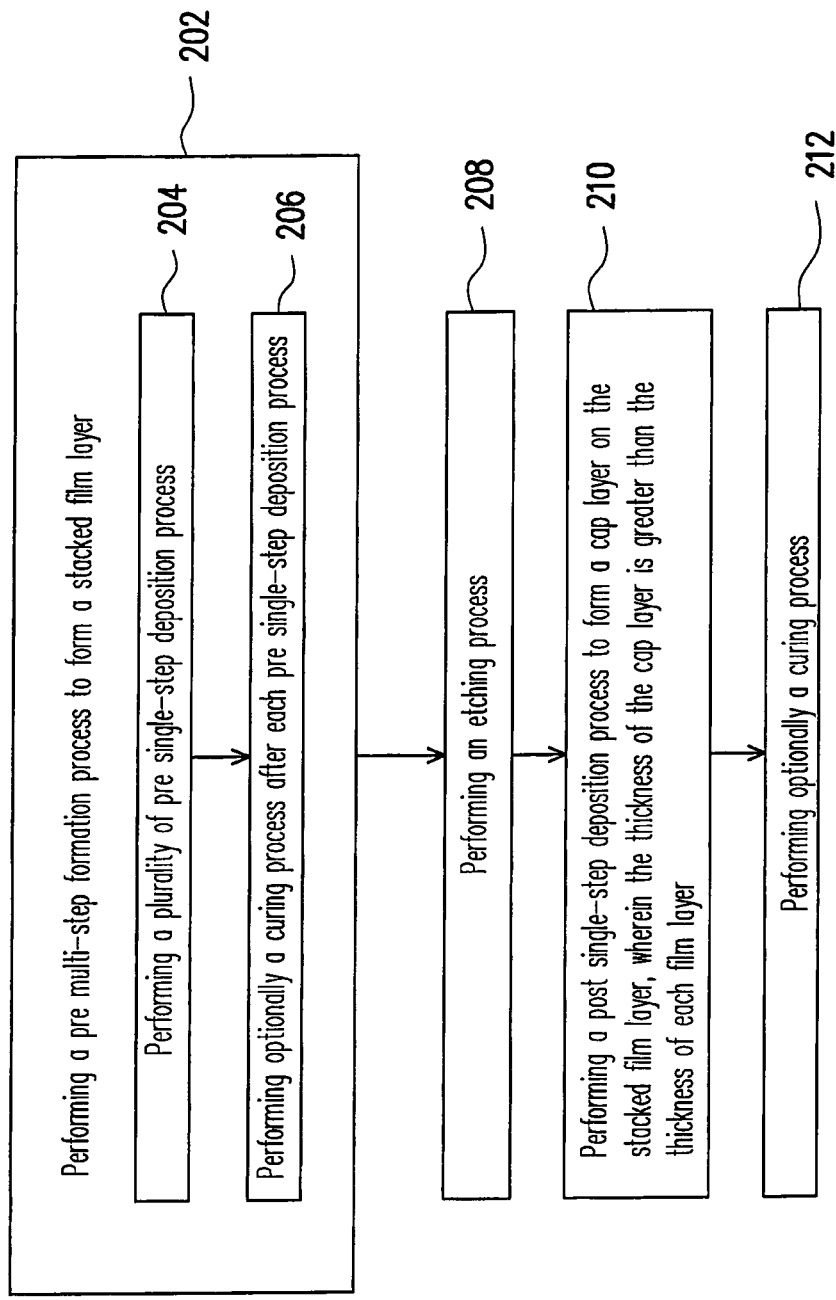
FIG. 2 is a flow chart of steps in exemplary processes that may be used in the fabrication of a silicon nitride gap-filling layer according to an embodiment of the present invention.

FIG. 2 is a flow chart of steps in exemplary processes that may be used in the fabrication of a silicon nitride gap-filling layer according to an embodiment of the present invention.

Referring to FIG. 2, the method of forming the silicon nitride gap-filling layer of this embodiment of the invention includes performing a pre-multi-step formation process to form a stacked film layer in step 202. Thereafter, a post single-step deposition process is performed to form a cap layer on the stacked film layer in step 210. In step 210, the thickness of the cap layer formed in the post single-step deposition process is greater than the thickness of each film layer of the stacked film layer formed in the pre-multi-step formation process. Hence, the stacked film layer establishes a dense film, while the cap layer establishes a sparse film.

In step 202, the pre-multi-step formation process includes performing a plurality of pre single-step deposition processes in step 204 and optionally performing a curing process after each pre single-step deposition process in step 206 to enhance the tensile stress of each film layer of the stacked film layer. Each of the pre single-step deposition process in step 204 includes but not limited to performing atomic layer deposition (ALD), plasma enhanced chemical vapor deposition (PECVD) or high density plasma chemical vapor deposition (HDP), low pressure chemical vapor deposition (LPCVD). The curing process of step 206 includes irradiating with ultra-violet light or performing a rapid thermal process.

The single-step deposition process in step 210 includes performing ALD, PECVD, HDP or LPCVD.

In one embodiment, the thickness of each film layer of the stacked film layer is about 100 angstroms to about 500 angstroms thick. The thickness of the cap layer is between about 500 angstroms to about 1000 angstroms. Since the thickness of each film layer of the stacked film layer is thin, the problems of tearing of each film layer of the stacked film layer due to the curing process performed after deposition can be obviated.

The stress of each film layer of the stacked film layer can be the same or different. The stress of each film layer of the stacked film layer and the stress of the cap layer can be the same or different. In one embodiment, the stress of each film layer of the stacked film layer is greater than the stress of the cap layer. For example, the stress of each film layer of the stacked film layer is about 1.5 GPa, while the stress of the cap layer is about 1.2 GPa.

Subsequent to performing the post single-step deposition process, a curing process may optionally performed in step 212 to enhance the stress layer of the cap layer. Hence, the stress of the cap layer is compatible to or higher than the stress of each film layer of the stacked layer. The curing process includes performing ultra-violet light irradiation or a rapid thermal process.

In one aspect of the invention, subsequent to the pre-multi-step formation process (step 202), the stacked film layer may have an overhang problem. Hence, prior to performing the post single-step deposition process (step 210), an etching process may optionally perform in step 208 to mitigate or eliminate the overhang situation of the stacked film layer. The etching process may include an anisotropic etching process, for example, a dry etching process such as plasma etching.

The fabrication method of a silicon nitride gap-filling layer of the embodiment is applicable to a rough and non-planarized surface, which will be described more fully hereinafter. This invention may, however, be embodied in many different forms and should not be construed as limited to the embodiments set forth herein.

Figure 3A:
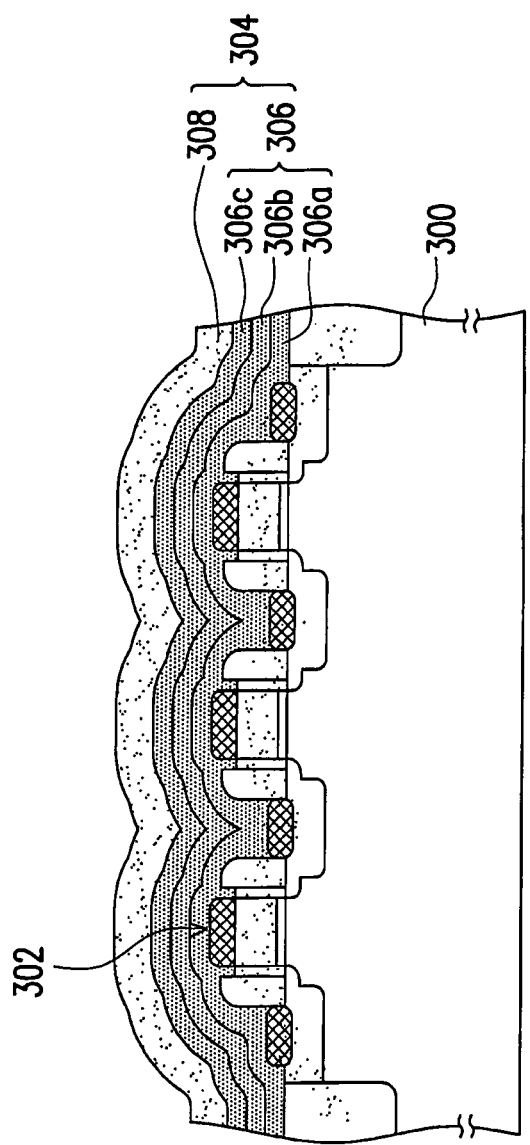
FIGS. 3A to 3C are schematic, cross-sectional views showing selected steps for fabrication of a semiconductor device that includes a silicon nitride contact etch stop layer according to an embodiment of the present invention.
Figure 3B:
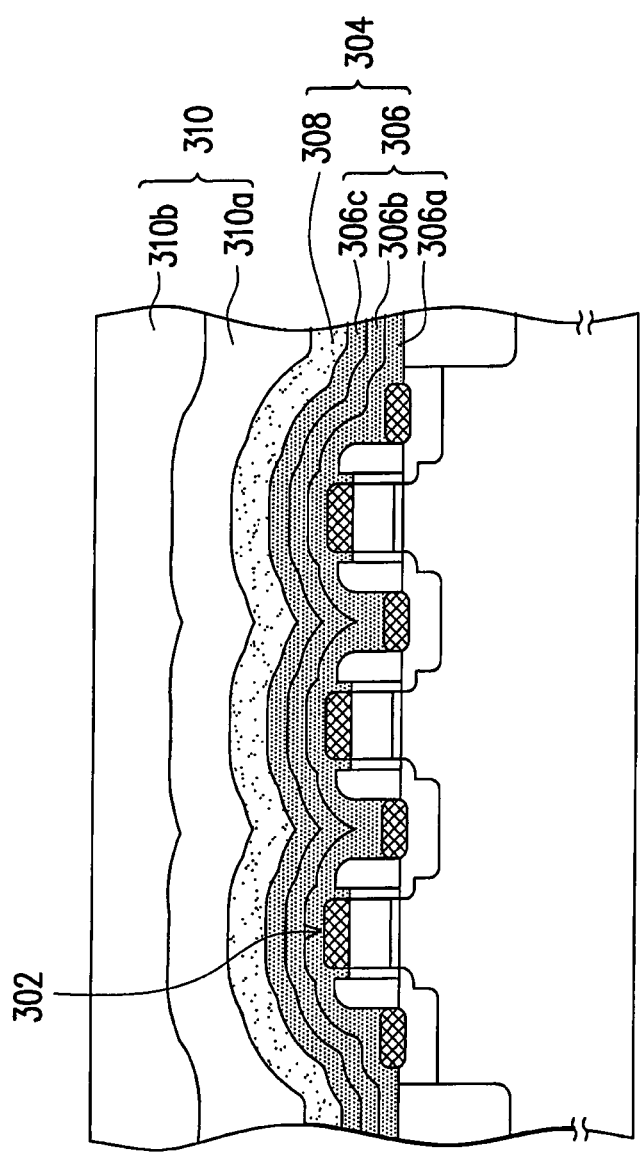
Figure 3C:
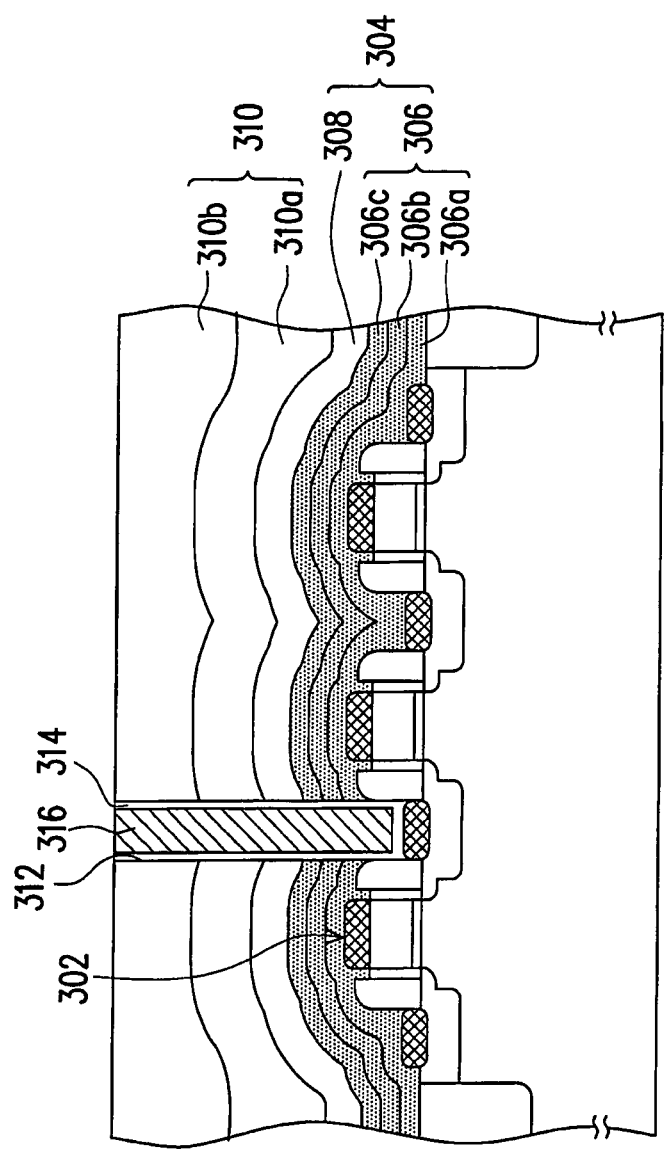

FIGS. 3A to 3C are schematic, cross-sectional views showing selected steps for fabrication of a semiconductor device that includes a silicon nitride contact etch stop layer according to an embodiment of the present invention.

Referring to FIG. 3A, a substrate 300 is provided. A substrate 300 is provided, wherein the substrate 300 is constituted with a material includes but not limited to a semiconductor major material, such as doped silicon or a silicon germanium compound or a silicon-on-insulator, etc. A plurality of devices 302 having rough and bumpy surface is formed on the substrate 300. The devices include N-channel metal oxide semiconductor device.

Still referring to FIG. 3A, a substrate 300 is provided, wherein the substrate 300 is constituted with a material including but not limited to a semiconductor major material, such as doped silicon or silicon-germanium compound or silicon-on-insulator, etc. A plurality of devices 302 having an uneven and non-planarized surface is formed on the substrate 300. The devices include N-channel metal oxide semiconductor (NMOS) devices, for example.

Still referring to FIG. 3A, a contact etching stop layer 304 is formed on the substrate 300. The contact etching stop layer 304 is formed, for example with a material including silicon nitride, using the above-mentioned method, in which a pre-multi-step formation process is performed to form a stacked film layer 306, followed by performing a post single-step deposition process to form a cap layer 308 on the stacked film layer 306.

The pre-multi-step formation process includes performing a plurality of pre single-step deposition processes. Further, subsequent to each pre single-step deposition process, a curing process is optionally performed to enhance, respectively the tensile stress of each film layer 306a, 306b, 306c of the stacked film layer 306. The total film layers of the stacked film layer are defined according to the practical demands, for example, 3 to 10 layers, wherein the stress between each film layer 306a, 306b, 306c of the stacked film layer 306 can be different, for example, having decreasing stress from the interior to the exterior, which is achievable by controlling the concentration of the reactants or energy. In this embodiment, three film layers are used to convey the scope of the invention and should not be construed as limited to the embodiments set forth herein. Each pre single-step deposition process includes performing atomic layer deposition (ALD), plasma enhanced chemical vapor deposition (PECVD), high density plasma chemical vapor deposition (HDP) or low pressure chemical vapor deposition (LPCVD).

In one embodiment, each single step deposition process is accomplished by performing PECVD, using silane ($SiH_4$) and ammonia ($NH_3$) and nitrogen ($N_2$) as a reaction gas source. The gas flow rate of $SiH_4$ is about 20 to 2000 sccm, and the gas flow rate of $NH_3$ is about 50 to 10000 sccm, and the gas glow rate of $N_2$ is about 500 to 30000 sccm. The process temperature is about 200 to 700 degrees, and the high frequency electrical power of radio frequency is about 40 to 3000 watts. Each curing process is performed, for example, using 100 to 400 nm of ultra-violet light as a light source, at a temperature of about 150 to 700 degrees Celsius depending on the silicide layer of the devices 302, a process period of about 10 seconds to about 60 minutes, a pressure of about 10 to 760 torrs, and an electrical power of about 50 to 1000 watts.

The thickness of each film layer 306a, 306b, 306c of the stacked film layer 360 formed according to the pre-multi-step formation process can be the same or different. In one embodiment, the thickness of each film layer 306a, 306b, 306c of the stacked film layer 306 is about 100 angstroms to about 500 angstroms, for example. Further, the total thickness of the stacked film layer 306 is defined according to the actual demands. Since the pre-multi-step formation process of the embodiment includes performing a plurality of single-step deposition processes and optionally performing a curing process after each single-step deposition process, the thickness of each film layer 306a, 306b, 306c is thin and each film layer is conformal to provide a sufficient gap-filling capability. Further, since each film layer 306a, 306b, 306c is thin, each film layer 306a, 306b, 306c of the stacked film layer 306 is prevented from tearing resulted from the curing process subsequent to the deposition.

The post single-step deposition process for forming the cap layer 308 includes but not limited to ALD, PECVD, HDP or LPCVD. In one embodiment, each single-step deposition process includes performing PECVD, using $SiH_4$ and $NH_3$ and $N_2$ as a reacting gas, wherein the gas flow rate of $SiH_4$ is about 20 to 2000 sccm, the gas flow rate of $NH_3$ is about 30 to 10000 sccm, the gas flow rate of $N_2$ is about 500 to 30000 sccm. The process temperature is about 200 to 700 degrees Celsius, and the high frequency electrical power of radio frequency is about 40 to 3000 watts.

The thickness of the cap layer 308 formed according to the post single-step deposition process and the thickness of the stacked layer 306 form the pre-determined total thickness. In one embodiment, the thickness of the cap layer 308 is greater than the thickness of each film layer 306a, 306b, 306c of the stacked film layer 306 formed according to the pre-multi-step formation process. The thickness of the cap layer 308 is between about 500 angstroms to about 1000 angstroms.

The thickness of each film layer 306a, 306b, 306c of the stacked film layer formed according to the pre-multi-step formation process and the stacked film layer constitutes a dense film. The cap layer of the post single-step deposition process is relatively thicker, and the cap layer constitutes a sparse film. In one embodiment, the thickness of the sparse film of the cap layer 308 is least about 10% of the total thickness of the stacked film layer 306 and the cap layer 308. The total thickness of the stacked film layer 306 and the thickness of the cap layer 308 are defined according to the actual demands.

The stress of each film layer 306a, 306b, 306c of the stacked film layer formed according to the pre-multi-step formation process can be the same or different, which can be adjusted according to the actual demands, for example, by adjusting the gas flow rates of $SiH_4$ and $NH_3$ and the electrical power of radio frequency of the pre single-step deposition process. In one embodiment, the stress of each film layer 306a, 306b, 306c of the stacked film layer 306 is greater than the stress of the cap layer to provide the devices 302 with sufficient stress. For example, the stress of each film layer 306a, 306b, 306c of the stacked film layer 306 is about 1.5 GPa, and the stress of the cap layer 308 is about 1.2 GPa.

A curing process can optionally performed after the single-step deposition process is completed to enhance the stress of the cap layer 308. Hence, the stress of the cap layer 308 is compatible to or higher than the stress of each film layer 306a, 306b, 306c of the stacked layer 306. The curing process includes performing ultra-violet light irradiation or rapid thermal process. In one embodiment, the process condition of the curing process includes a process temperature of about 150 to 700 degrees Celsius, a process period of about 10 seconds to 60 minutes, a pressure of about 10 to 76 torrs, an electrical power of about 50 to 1000 watts and a ultra-violet light source of about 100 to 400 nm.

Thereafter, referring to FIG. 3B, a dielectric layer 310 is formed on the contact etching stop layer 304. The dielectric layer 310 is formed with an undoped silicon glass (USG) layer 310a and a phosphorous silicon glass (PSG) layer 310b. The dielectric layer 310 is formed by chemical vapor deposition. After forming the phosphorous silicon glass layer, a chemical mechanical polishing process is performed to planarize the surface.

Continuing to FIG. 3C, photolithograph and etching processes are performed to form a contact opening 312 in the dielectric layer 310 and the contact etching stop layer 304. Thereafter, a barrier layer 314 and a conductive layer 316 are formed in the contact opening 312. The material of the barrier layer 314 includes titanium/titanium nitride, for example. The conductive layer 316 is constituted with a material includes tungsten, for example.

Figure 4A:
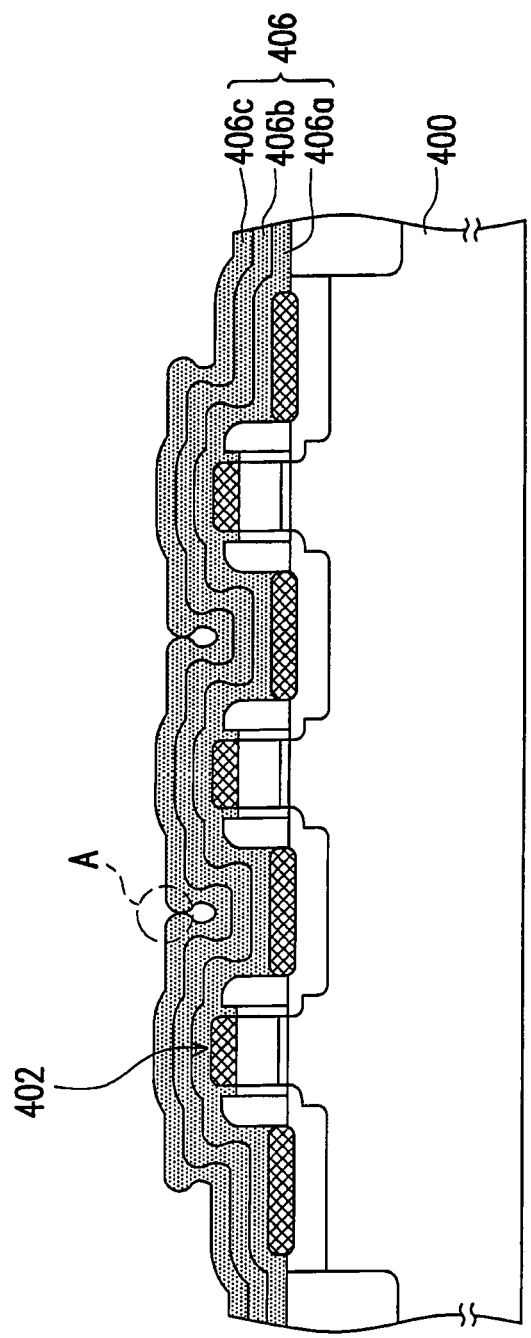
FIGS. 4A to 4C are schematic, cross-sectional views showing selected steps for fabrication of a semiconductor device that includes a silicon nitride contact etch stop layer according to another embodiment of the present invention.
Figure 4B:
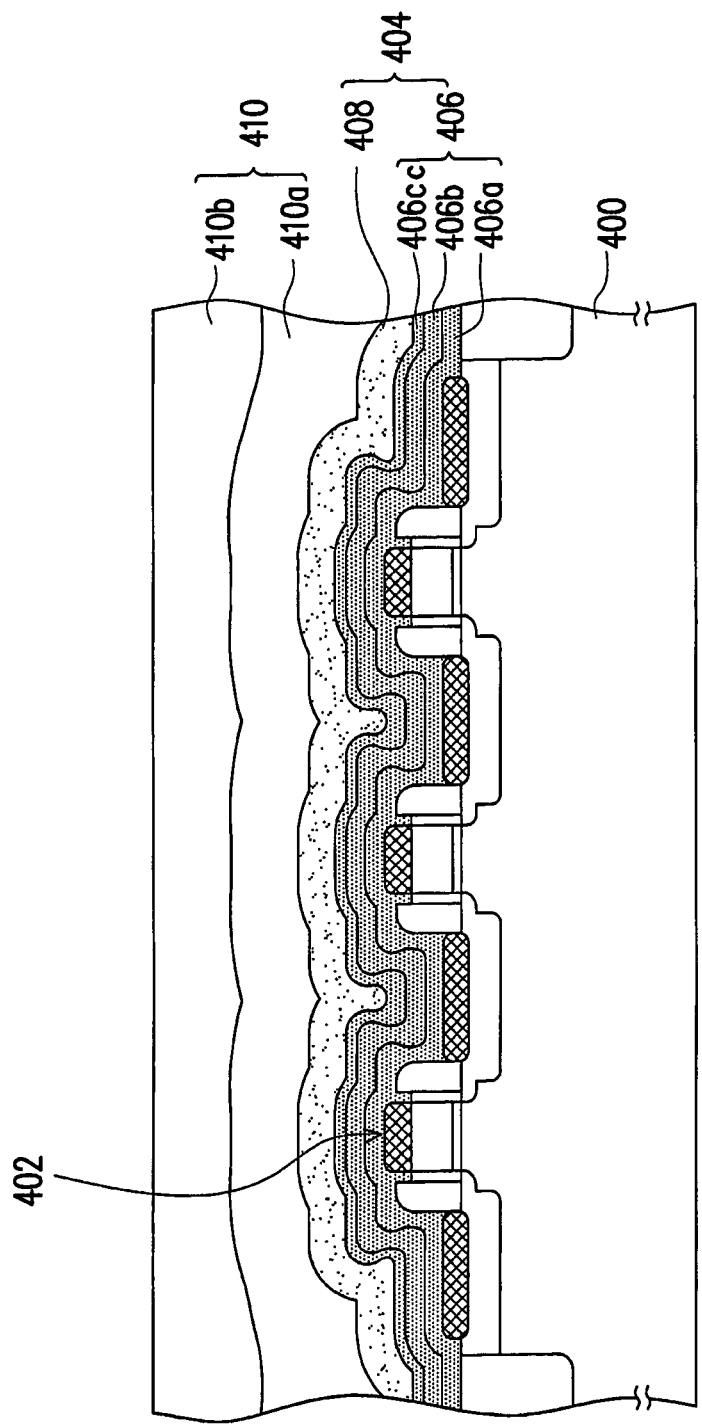
Figure 4C:
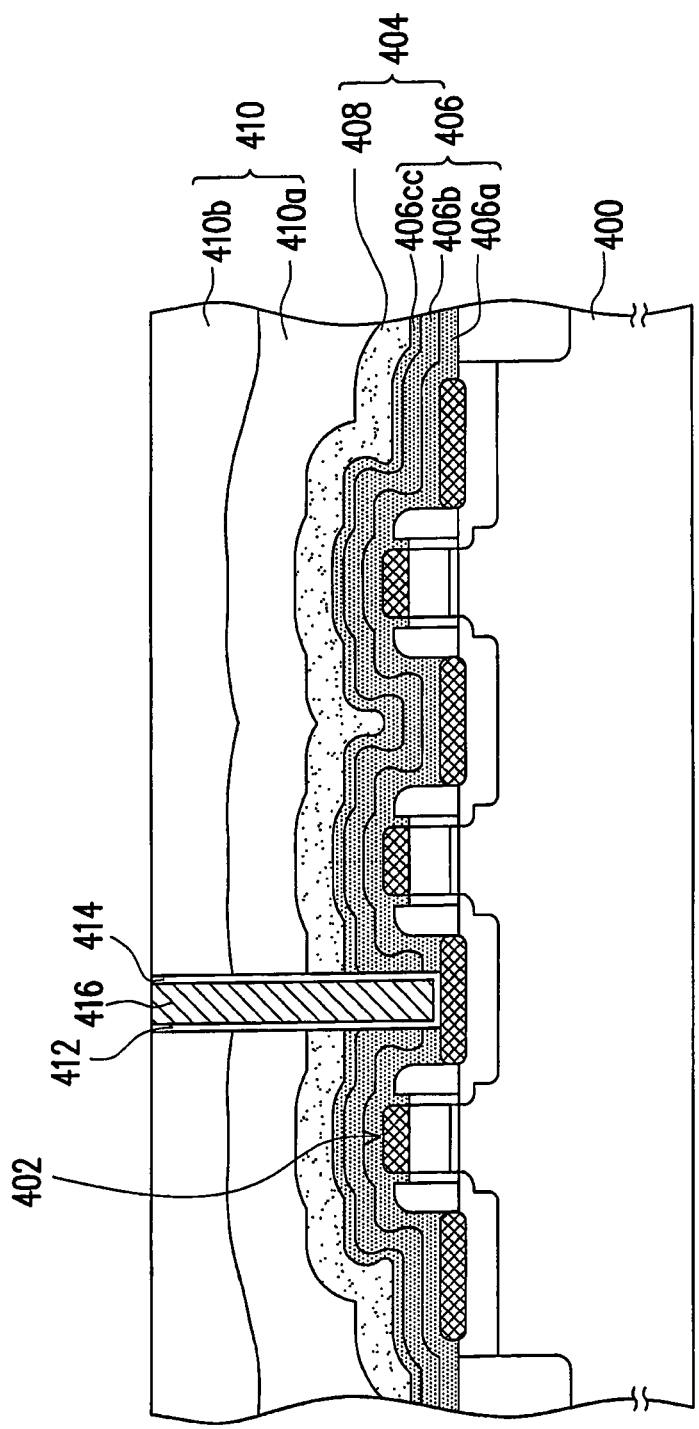

FIGS. 4A to 4C are schematic, cross-sectional views showing selected steps for the fabrication of a semiconductor device that includes a silicon nitride contact etch stop layer according to another embodiment of the present invention.

Referring to FIG. 4A, in another embodiment, a pre-multi-step formation process is performed as in the above embodiment to form a stacked film layer 406 on a substrate 400. Due to the non-planarity of the device 402 already formed on the substrate 400, the stacked film layer 406 may have an overhang problem as depicted by the dashed line "A" region.

Continuing to FIG. 4B, to mitigate the overhang problem, in this embodiment, subsequent to the pre-multi-step formation process, an etching process is performed to remove a portion of the stacked film layer 406. For example, a portion of the film layer 406c is removed to form an overhang-free film layer 406cc. The etching process includes, for example, a back etching process, in which an anisotropic etching, for example, dry etching such as plasma etching, may be conducted.

Thereafter, according to this embodiment of the invention, the single-step deposition process is performed to form a cap layer 408 on the stacked film layer 406. A curing process may optionally perform subsequently to enhance the stress of the cap layer 408 for the stress of the cap layer 408 be compatible or higher than the stress of each film layer 406a, 406b, 406c of the stack film layer 406. The cap layer 408 and the stacked film layer 406 constitute the contact etch stop layer 404. Similar to the above embodiment, a dielectric layer 410 is then formed on the contact etching stop layer 404. The dielectric layer 410 includes but not limited to undoped silicon glass layer 410a and phosphorous silicon glass (PSG) layer 410b.

Referring to FIG. 4C, photolithograph and etching processes are performed to form a contact opening 412 in the dielectric layer 410 and the contact etching stop layer 404. A barrier layer 414 and a conductive layer 416 are subsequently formed in the contact opening 412.

Not only the contact etching stop layer formed according to the present invention has sufficient thickness and stress to enhance the ion gain of the device and to increase the efficiency of the device, the gap-filling capability is effectively improved to obviate problems generated from seam formation.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a silicon nitride gap-filling layer, comprising:
  performing a multi-step formation process to form stacked film layers constituting a dense film, on a substrate;
  after performing the multi-step formation process, performing a post single-step deposition process to form a cap layer constituting a sparse film on the stacked film layers; and
  performing a curing process to enhance a stress of the cap layer, wherein a thickness of the cured cap layer is greater than a thickness of each of the stacked film layers and is at least about 10% of a total film thickness of the stacked film layers and the cap layer.

2. The method of claim 1, wherein an etching process is performed subsequent to the multi-step formation process and prior to the post single-step deposition process to remove a portion of the dense film.

3. A method of fabricating a silicon nitride gap-filling layer, comprising:
  performing a multi-step formation process to form stacked film layers for establishing a dense film, on a substrate, wherein the dense film is consisted of the stacked film layers; and
  after performing the multi-step formation process, performing a post single-step deposition process to form a cap layer constituting a sparse film on the dense film; and
  performing a curing process to enhance a stress of the cap layer, wherein a thickness of the cap layer is at least about 10% of a total film thickness of the dense film and the cap layer, the thickness of the cured cap layer is larger than a thickness of each of the stacked film layers, and material of the cap layer and material of the stacked film layers are the same.

4. The method of claim 1, wherein the multi-step formation process comprises:
  performing a plurality of single-step deposition processes; and
  performing a curing process respectively after each single-step deposition process of the multi-step formation process.

5. The method of claim 4, wherein each single-step deposition process of the multi-step formation process comprises performing atomic layer deposition (ALD), plasma enhanced chemical vapor deposition (PECVD), high density plasma chemical vapor deposition (HDP) or low pressure chemical vapor deposition (LPCVD).

6. The method of claim 4, wherein process conditions of each single-step deposition process of the multi-step formation process comprise a flow rate of silane (SiH4) of about 20 to 2000 sccm, a flow rate of ammonia (NH3) of about 50 to 10000 sccm, a flow rate of nitrogen (N2) of about 500 to 30000 sccm, a process temperature of about 200 to 700 degrees Celsius and a high frequency power of radio frequency of about 40 to 3000 watts.

7. The method of claim 4, wherein process conditions of each curing process of the multi-step formation process comprise a process temperature of about 150 to 700 degrees Celsius, a process period of about 10 seconds to 60 minutes, a pressure of about 10 to 760 torrs, an electrical power of about 50 to 1000 watts, and an ultra-violet light source of about 100 to 400 nm.

8. The method of claim 4, wherein each film layer of the stacked film layers is a conformal layer.

9. The method of claim 8, wherein each film layer of the stacked film layers is about 100 angstroms to about 500 angstroms thick.

10. The method of claim 1, wherein the cap layer is about 500 to about 10000 angstroms thick.

11. The method of claim 1, wherein the post single-step deposition process includes performing ALD, PECVD, HDP or LPCVD.

12. The method of claim 1, wherein process conditions of the post single-step deposition process comprises a gas flow rate of silane (SiH4) of about 20 to 2000 sccm, a flow rate of ammonia (NH3) of about 50 to 10000 sccm, a flow rate of nitrogen (N2) of about 500 to 30000 sccm, a process temperature of about 200 to 700 degrees Celsius and a high frequency power of radio frequency of about 40 to 3000 watts.

13. The method of claim 1, wherein the stress of each film layer of the stacked film layers is about 1.5 GPa.

14. The method of claim 1, wherein the stress of the cap layer is about 1.2 GPa.

15. The method of claim 4, wherein process conditions of the curing process to enhance a stress of the cap layer comprise a process temperature of about 150 to 700 degrees Celsius, a process period of about 10 seconds to 60 minutes, a pressure of about 10 to 760 torrs, an electrical power of about 50 to 1000 watts, and an ultra-violet light source of about 100 to 400 nm.

16. The method of claim 1, wherein an etching process is performed subsequent to the multi-step formation process and prior to the post single-step deposition process to remove a portion of the dense film.

17. The method of claim 1, wherein the dense film has decreasing stress from a side thereof adjacent to the substrate to another side thereof far away from the substrate.

* * * * *